United States Patent
Strachan et al.

(10) Patent No.: US 7,214,992 B1
(45) Date of Patent: May 8, 2007

(54) MULTI-SOURCE, MULTI-GATE MOS TRANSISTOR WITH A DRAIN REGION THAT IS WIDER THAN THE SOURCE REGIONS

(75) Inventors: Andy Strachan, Santa Clara, CA (US); Douglas Brisbin, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/974,145

(22) Filed: Oct. 27, 2004

(51) Int. Cl.
*H01L 27/088* (2006.01)
(52) U.S. Cl. .................. 257/401; 257/E27.06
(58) Field of Classification Search ........... 257/327, 257/368, 393, 401, E27.06
See application file for complete search history.

(56) References Cited

U.S. PATENT DOCUMENTS 5,998,845 A * 12/1999 Ludikhuize ............ 257/401

2002/0072159 A1 * 6/2002 Nishib et al. ........... 438/179

OTHER PUBLICATIONS

U.S. Appl. No. 10/974,146, filed Oct. 27, 2004, Brisbin et al.
U.S. Appl. No. 10/974,142, filed Oct. 27, 2004, Brisbin et al.
Douglas Brisbin, Andy Strachan and Prasad Chaparala, "PMOS Drain Breakdown Voltage Walk-in: A New Failure Mode in High Power BiCMOS Applications", IEEE 2004 International Reliability Physics Symposium, Apr. 25-29, 2004, pp. 1-4 (Unnumbered).

* cited by examiner

*Primary Examiner*—Douglas W. Owens
*Assistant Examiner*—Andrew O. Arena
(74) *Attorney, Agent, or Firm*—Mark C. Pickering

(57) ABSTRACT

The drain breakdown voltage walk-in of a dual-source, dual-gate PMOS transistor is significantly reduced by utilizing source regions which have a width that is equal to or less than a width of the drain region. By utilizing source regions with widths that are equal to or less than the width of the drain region, the current density in the drain region is significantly reduced which reduces the number of hot charge carriers that are trapped at the silicon-to-silicon dioxide interface which, turn in, reduces the drain breakdown voltage walk-in rate.

10 Claims, 4 Drawing Sheets

MULTI-SOURCE, MULTI-GATE MOS TRANSISTOR WITH A DRAIN REGION THAT IS WIDER THAN THE SOURCE REGIONS

BACKGROUND OF THE INVENTION

1. Field of the Invention

The present invention relates to MOS transistors and, more particularly, to a multi-source, multi-gate MOS transistor with a drain region that is wider than the source regions.

2. Description of the Related Art

A MOS transistor is a well-known semiconductor device that can be fabricated in many well known ways. MOS transistors can be formed as n-channel (NMOS) devices or as p-channel (PMOS) devices. In addition, MOS transistors can be formed as low-voltage devices or as high-voltage devices.

FIGS. 1A and 1B show views that illustrate a prior-art, single-source, single-gate, high-voltage PMOS transistor 100. FIG. 1A shows a schematic layout that represents a plan view of transistor 100, while FIG. 1B shows a cross-sectional view of transistor 100 taken along line 1B—1B of FIG. 1A.

As shown in FIGS. 1A and 1B, PMOS transistor 100 includes an n-type semiconductor material 110, and spaced-apart p-type source and drain regions 112 and 114 that are formed in semiconductor material 110. Source region 112 includes a heavily-doped (p+) region, while drain region 114 includes an extended lightly-doped (p−) region 114A and a heavily-doped (p+) region 114B.

PMOS transistor 100 also includes a channel region 116 of semiconductor material 110 that lies between the source and drain regions 112 and 114, and a layer of insulation material 120, such as gate oxide, that lies over channel region 116. Further, transistor 100 includes a gate 122, such as polysilicon, that lies on insulation material 120 over channel region 116.

In addition, PMOS transistor 100 includes an isolation material ISO that surrounds transistor 100. Isolation material ISO lies adjacent to the two short sides, and the long side of p+ drain region 114B. P+ drain region 114B must be formed a distance $W_C$ from the nearest edge of isolation material ISO. On the other hand, isolation material ISO contacts source region 112, extended p− region 114A, and channel region 116.

In operation, when a negative drain-to-source voltage $V_{DS}$ is present, and the gate-to-source voltage $V_{GS}$ is more negative than the threshold voltage, PMOS transistor 100 turns on and holes flow from source region 112 to drain region 114. When the gate-to-source voltage $V_{GS}$ is more positive than the threshold voltage, PMOS transistor 100 turns off and no holes (other than a very small leakage current) flow from source region 112 to drain region 114.

FIGS. 2A and 2B show views that illustrate a prior-art, dual-source, dual-gate, high-voltage PMOS transistor 200. FIG. 2A shows a schematic layout that represents a plan view of transistor 200, while FIG. 2B shows a cross-sectional view of transistor 200 taken along line 2B—2B of FIG. 2A.

As shown in FIGS. 2A and 2B, PMOS transistor 200 includes an n-type semiconductor material 210, spaced-apart p-type source regions 212A and 212B that are formed in semiconductor material 210, and a drain region 214 that is formed in semiconductor material 210 between, and spaced apart from, the source regions 212A and 212B.

Source regions 212A and 212B have heavily-doped (p+) regions. On the other hand, drain region 214 includes an extended lightly-doped (p−) region 214A, and a heavily-doped (p+) region 214B that is surrounded at the surface by p− region 214A. Drain region 214 always receives holes when transistor 200 is turned on, while source regions 212A and 212B always provide holes when transistor 200 is turned on. In addition, source regions 212A and 212B have a width W1 that is greater than a width W2 of p+ drain region 214B.

PMOS transistor 200 also includes a first channel region 216A of semiconductor material 210 that lies between the source and drain regions 212A and 214A, and a second channel region 216B of semiconductor material 210 that lies between the source and drain regions 212B and 214A.

In addition, PMOS transistor 200 includes an isolation material ISO that surrounds transistor 200. Isolation material ISO contacts the source regions 212A and 212B, the extended p− region 214A, and the first and second channel regions 216A and 216B. Further, both the top and bottom sides of p+ drain region 214B must be formed a width $W_C$ from the nearest edge of isolation material ISO. As a result, the width W2 of p+ drain region 214B is 2 $W_C$ less than the width W1 of p+ source and drain regions 212A and 212B.

PMOS transistor 200 additionally includes a first insulation layer 220A, such as gate oxide, that lies over channel region 216A, and a second insulation layer 220B, such as gate oxide, that lies over channel region 216B. PMOS transistor 200 further includes a first gate 222A, such as polysilicon, that lies on insulation layer 220A over channel region 216A, and a second gate 222B, such as polysilicon, that lies on insulation layer 220B over channel region 216B.

In operation, when source regions 212A and 212B are electrically connected together, gates 222A and 222B are electrically connected together, a negative drain-to-source voltage $V_{DS}$ is present, and the gate-to-source voltage $V_{GS}$ is more negative than the threshold voltage, PMOS transistor 200 turns on and holes flow from both of the source regions 212A and 212B to drain region 214.

When the gate-to-source voltage $V_{GS}$ is more positive than the threshold voltage, PMOS transistor 200 turns off and no holes (other than a very small leakage current) flow from the source regions 212A and 212B to drain region 214. Due to the multi-fingered structure, PMOS transistor 200 sources more current than PMOS transistor 100.

PMOS transistors 100 and 200 are both in common use, with transistor 200 often being preferred over transistor 100 because of the greater current capacity and reduced effective area of transistor 200. One problem with transistor 200, however, is that transistor 200 has an accelerated drain breakdown voltage walk-in.

When PMOS transistor 200 is initially fabricated, transistor 200 has a drain-to-semiconductor material breakdown voltage. Over time, however, positive hot charge carriers become trapped at the silicon—silicon dioxide interface (between semiconductor material 210 and insulation layers 220A and 220B) near drain region 214 which, in turn, causes the drain breakdown voltage to change.

When the trapped charge carriers cause the drain breakdown voltage of a PMOS transistor to decrease over time, the process is known as drain breakdown voltage walk-in. (Walk-out can also occur.) Continued drain breakdown voltage walk-in eventually leads to the failure of the device. As a result, a device that has an accelerated drain breakdown voltage walk-in is a device that can fail prematurely due to changes in the drain breakdown voltage.

FIG. 3 shows a graph that illustrates the drain breakdown voltage walk-ins of five prior-art, high-voltage PMOS transistors when stressed for varying periods of time. In this example, the stress times and temperature are $V_{GS}=-14V$, $V_{DS}=-100V$, and Temp=110° C. When the drain breakdown voltage has walked-in by 30V, the device is considered to have failed.

The five high-voltage PMOS transistors include a (100/3.5) double gate (combined) transistor 310, a (100/3.5) double gate (separated) transistor 312 (which represents transistor 200), a (50/3.5) double gate (combined) transistor 314, a (100/3.5) single gate transistor 316 (which represents transistor 100), and a (50/3.5) single gate transistor 318.

As shown in FIG. 3, the drain breakdown voltage of PMOS transistor 316 (which represents PMOS transistor 100) remains unchanged when stressed up to 100 kS. After this, however, the drain breakdown voltage walks in quickly and exceeds the 30V failure point. On the other hand, the drain breakdown voltage of PMOS transistor 312 (which represents PMOS transistor 200) remains unchanged for only 100 s. After 300 s, the drain breakdown voltage also walks in quickly and exceeds the 30V failure point.

Thus, as shown in FIG. 3, dual-source, dual-gate, high-voltage PMOS transistor 312 (which represents transistor 200) has a drain breakdown voltage that walks-in approximately 500× faster than the drain breakdown voltage of single-source, single-gate, high-voltage PMOS transistor 318 (which represents transistor 100). As a result, there is a need for a high-voltage, multi-gate PMOS transistor that has a reduced drain breakdown voltage walk-in rate.

BRIEF DESCRIPTION OF THE DRAWINGS

FIG. 1A is a schematic layout that represents a plan view of transistor 100. FIG. 1B is a cross-sectional view of transistor 100 taken along line 1B—1B of FIG. 1A.

FIG. 2A is a schematic layout that represents a plan view of transistor 100. FIG. 2B is a cross-sectional view of transistor 200 taken along line 2B—2B of FIG. 2A.

FIG. 4A is a schematic layout that represents a plan view of transistor 400. FIG. 4B is a cross-sectional view of transistor 400 taken along line 4B—4B of FIG. 4A.

DETAILED DESCRIPTION OF THE INVENTION

Figure 1A:
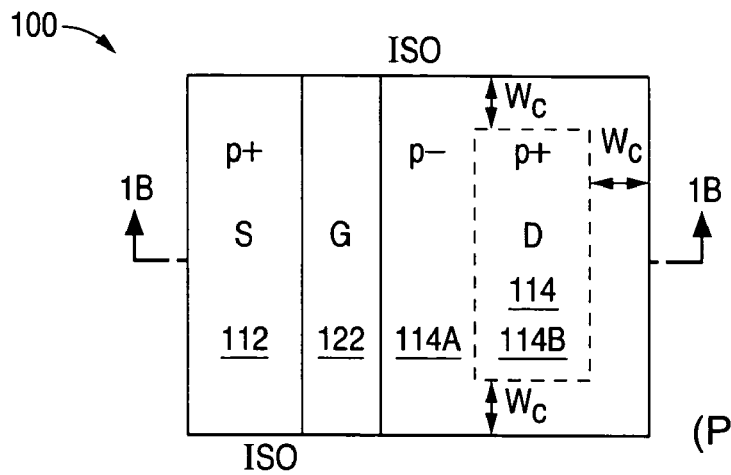
FIGS. 1A and 1B are views illustrating a prior-art, single-source, single-gate, high-voltage PMOS transistor 100.
Figure 1B:
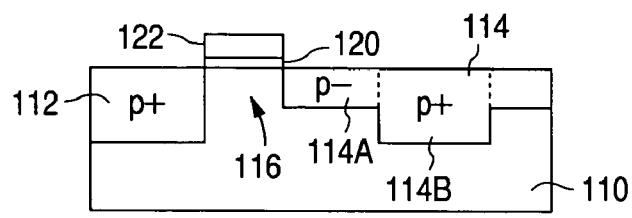
Figure 2A:
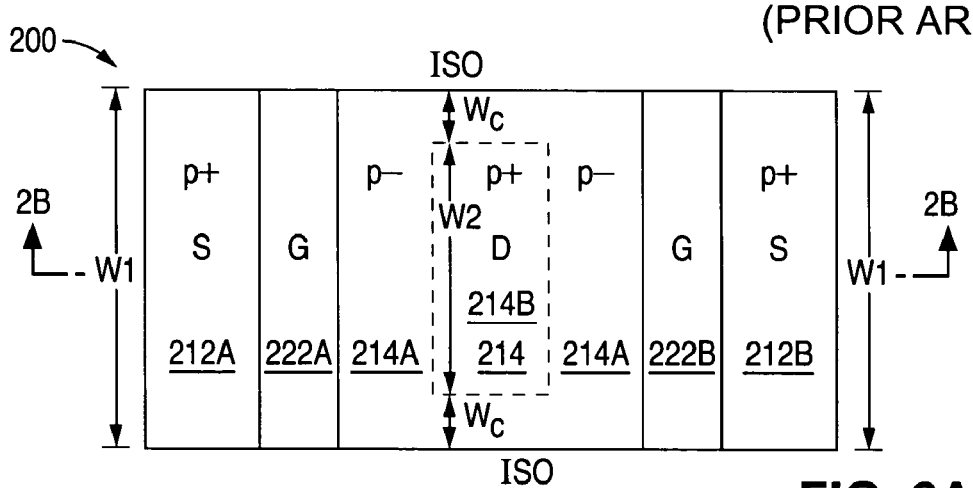
FIGS. 2A and 2B are views illustrating a prior-art, dual-source, dual-gate, high-voltage PMOS transistor 200.
Figure 2B:
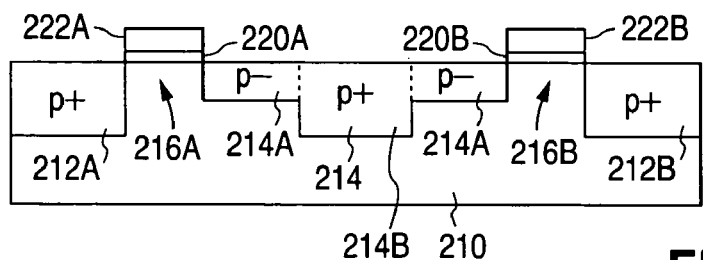
Figure 3:
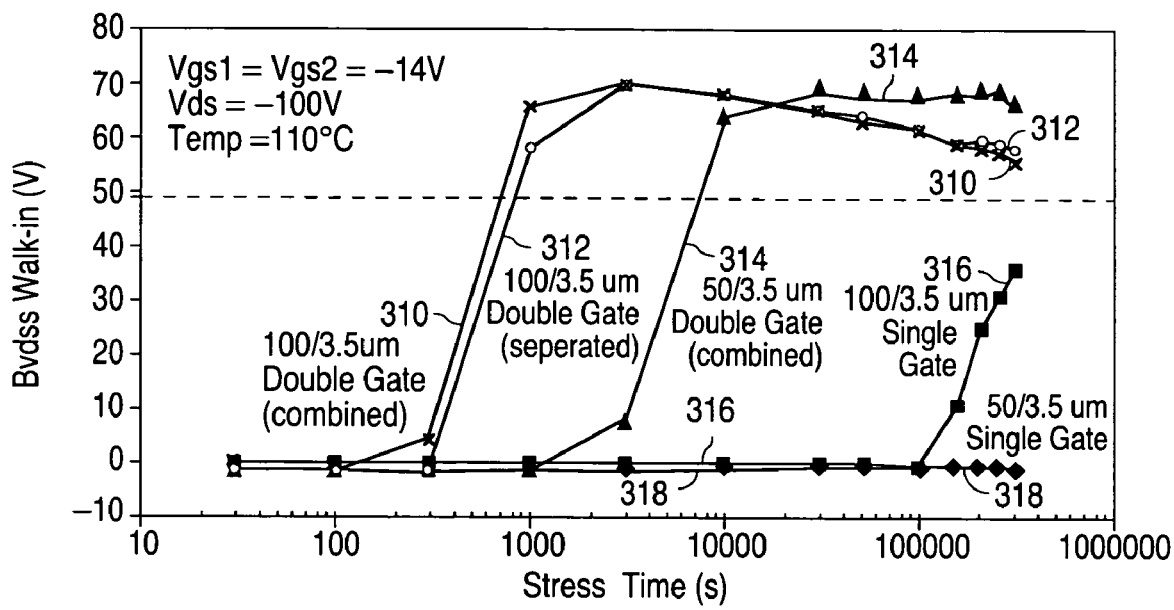
FIG. 3 is a graph illustrating the drain breakdown voltage walk-ins of five prior-art, high-voltage PMOS transistors when stressed for varying periods of time.
Figure 4A:
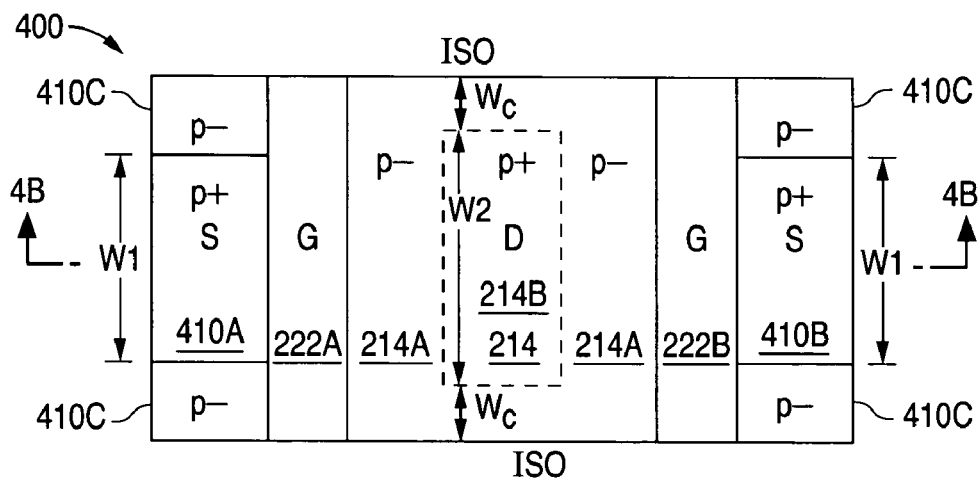
FIGS. 4A and 4B are views illustrating a dual-source, dual-gate, high-voltage PMOS transistor 400 in accordance with the present invention.
Figure 4B:
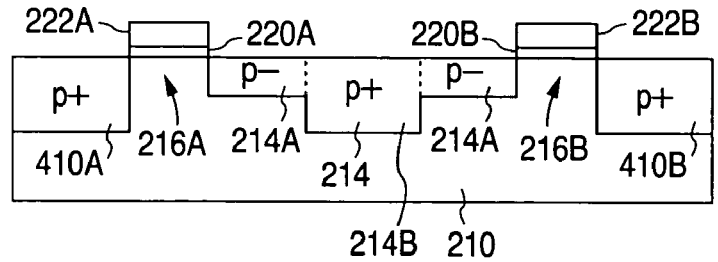

FIGS. 4A and 4B show views that illustrate a dual-source, dual-gate, high-voltage PMOS transistor 400 in accordance with the present invention. FIG. 4A shows a schematic layout that represents a plan view of transistor 400, while FIG. 4B shows a cross-sectional view of transistor 400 taken along line 4B—4B of FIG. 4A.

As described in greater detail below, the present invention reduces the widths of the source regions of a dual-source transistor with respect to the drain region to reduce the current density in the drain region which, in turn, significantly reduces the drain breakdown voltage walk-in.

Transistor 400 is similar to transistor 200 and, as a result, utilizes the same reference numerals to designate the structures which are common to both transistors. As shown in FIGS. 4A and 4B, transistor 400 differs from transistor 200 in that transistor 400 utilizes p+ source regions 410A and 410B in lieu of p+ source regions 212A and 212B. Drain region 214 always receives holes when transistor 400 is turned on, while source regions 410A and 410B always provide holes when transistor 400 is turned on.

In accordance with the present invention, p+ source regions 410A and 410B have a width W1 that is equal to or less than a width W2 of p+ drain region 214. To provide an orientation with respect to widths and lengths, holes flow from source regions 410A and 410B to drain region 214 in a direction normal to the width and parallel to the length. Thus, a width is defined to be normal to a hole flow when transistor 400 is turned on, while a length is defined to parallel to a hole flow when transistor 400 is turned on.

In the FIG. 4 example, the widths W1 of source regions 410A and 410B are less than the width W2 of p+ drain region 214B, while regions 214B, 410A, and 410B have substantially equal lengths as measured normal to the widths. For example, source regions 410A and 410B can be 50 um wide, while drain region 214 is 100 um wide.

In addition, transistor 400 also includes four spaced-apart, lightly-doped (p−) regions 410C that are formed in n-type semiconductor material 210. As shown in FIG. 4A, two of the lightly-doped regions 410C contact opposite ends of p+ source region 410A, while two of the lightly-doped regions 410C contact opposite ends of p+ source region 410B. Although not the best realization of the device, regions 410C can optionally be omitted.

In operation, when source regions 410A and 410B are electrically connected together, gates 222A and 222B are electrically connected together, a negative drain-to-source voltage $V_{DS}$ is present, and the gate-to-source voltage $V_{GS}$ is more negative than the threshold voltage, PMOS transistor 400 turns on and holes flow from source regions 410A and 410B to drain region 214. When the gate-to-source voltage $V_{GS}$ is more positive than the threshold voltage, PMOS transistor 400 turns off and no holes (other than a very small leakage current) flow from source regions 410A and 410B to drain region 214.

Figure 5A:
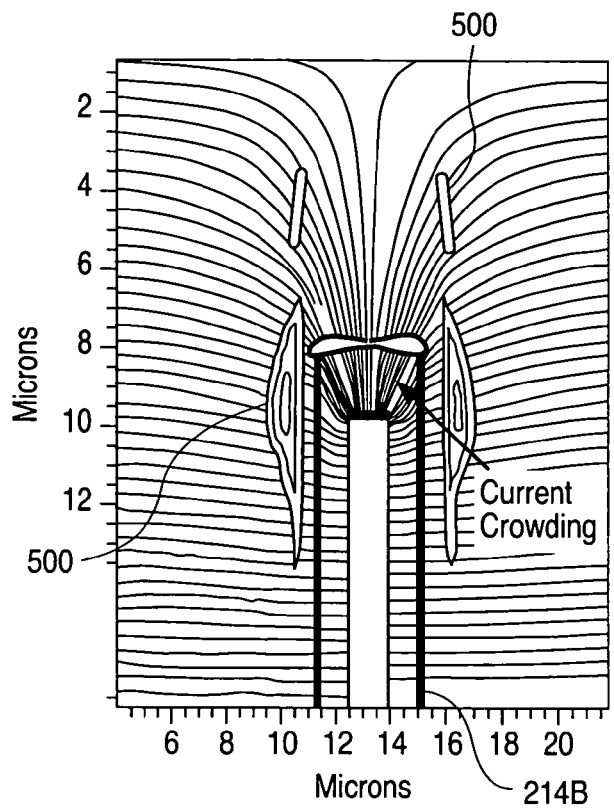
FIGS. 5A, 5B, and 5C are graphs illustrating simulated current contour plots in accordance with the present invention.
Figure 5B:
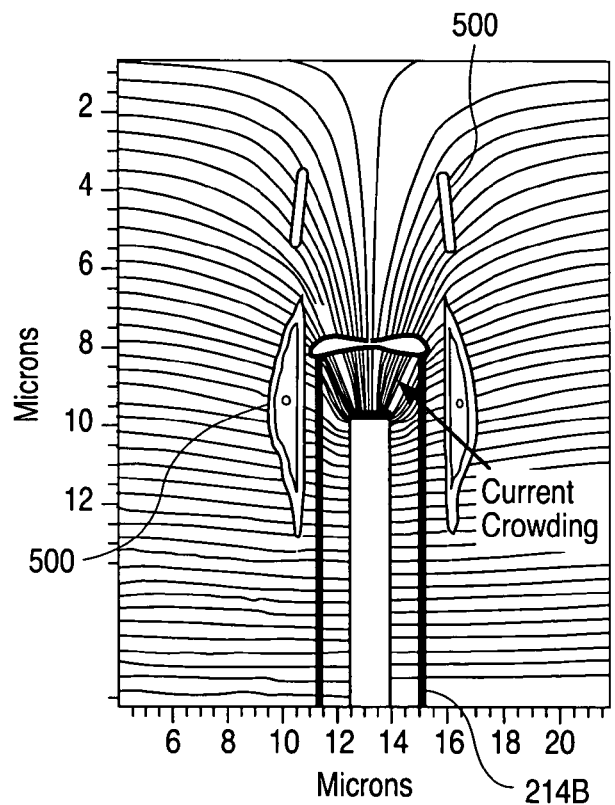
Figure 5C:
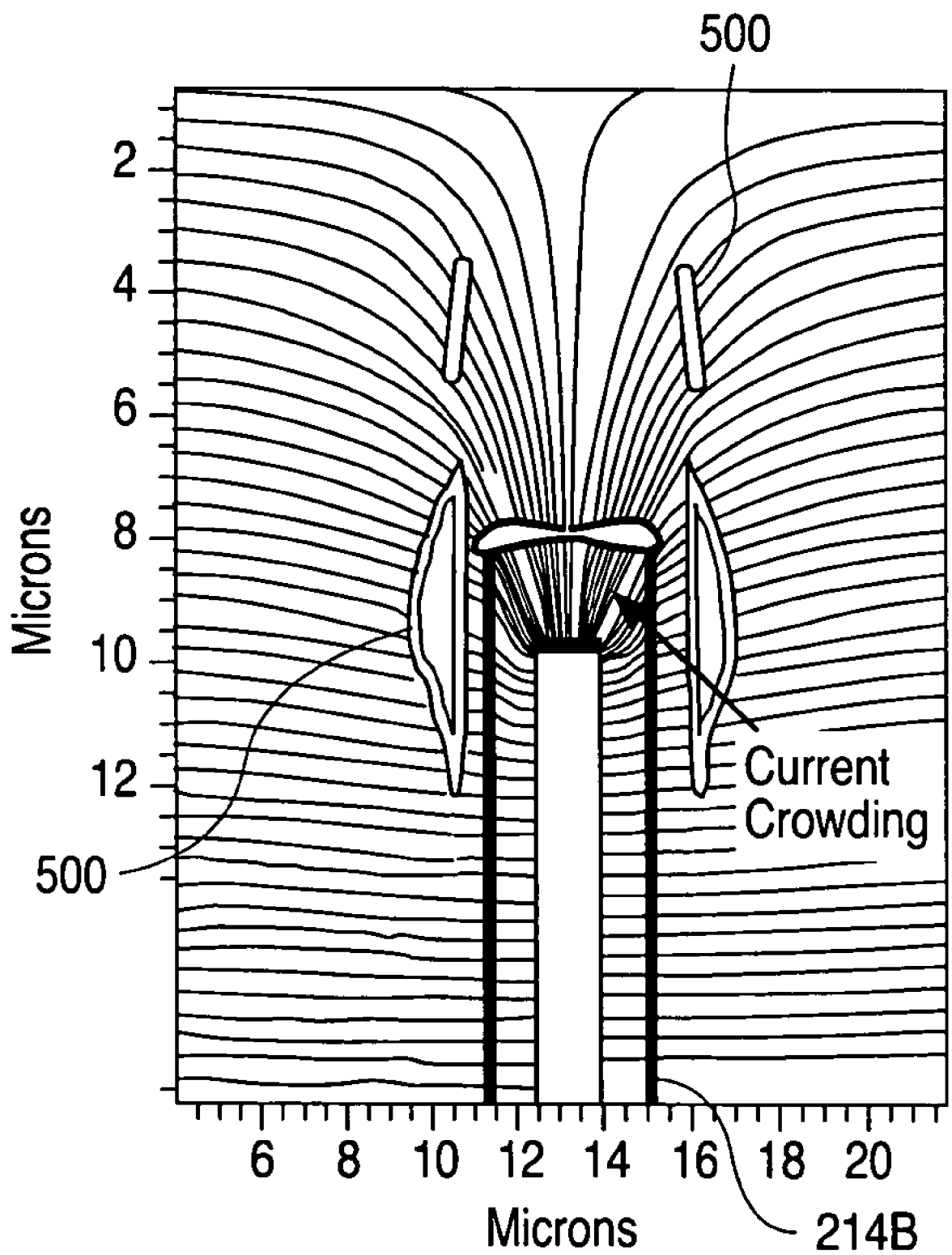

FIGS. 5A, 5B, and 5C show graphs that illustrate simulated current contour plots in accordance with the present invention. FIG. 5A shows a graph of p+ drain region 214B of transistor 200, FIG. 5B shows a graph of p+ drain region 214B of transistor 400 when the source and drain widths W1 and W2 are equal, and FIG. 5C shows a graph of p+ drain region 214B of transistor 400 when the source width W1 is less than the drain width W2. The current contour plots illustrate the paths taken by the holes as they approach the drain regions 214B.

As shown in FIG. 5A, when PMOS transistor 200 is turned on and holes flow from source regions 212A and 212B to drain region 214B, the paths taken by the holes near the end of drain region 214B are forced to crowd together. The current crowding leads to positive hot charge carrier trapping in the silicon-to-silicon dioxide interface near drain region 214B which, as noted above, leads to changes in the drain breakdown voltage.

The locations and intensities of the hot charge carrier trapping are illustrated by a number of bubbles 500. The bubbles 500 in FIG. 5 are read like a topographical map, with the smaller bubbles representing regions of relatively higher hot charge carrier trapping, and the larger bubbles representing regions of relatively lower hot charge carrier trapping.

Thus, as shown in FIG. 5A, PMOS transistor 200 has regions of relatively higher hot charge carrier trapping near the end of drain region 214B. By contrast, as shown in FIG. 5B, when the width W1 of p+ source regions 410A and 410B is equal to the width W2 of p+ drain region 214B, there is less current crowding. As a result, PMOS transistor 400 has smaller regions of relatively higher hot charge carrier trapping, and smaller regions of relatively lower hot charge carrier trapping near the end of drain region 214B.

As shown in FIG. 5C, when the width W1 of p+ source regions 410A and 410B is less than the width W2 of p+ drain region 214B, there is even less current crowding. In the FIG. 5C example, PMOS transistor 400 has no regions of relatively higher hot charge carrier trapping, and smaller regions of relatively lower hot charge carrier trapping near the end of drain region 214B.

Further, a trade off between increasing the overall size of transistor 400 and reducing the amount of current crowding should be considered. For example, a transistor with a drain width that is three times (3×) larger than a source width has less current crowding and hot carrier trapping than a transistor with a drain width that is only twice (2×) as large. However, the difference in current crowding and hot carrier trapping between a 2× and a 3× transistor may not justify the increased size of a 3× transistor.

It should be understood that the above descriptions are examples of the present invention, and that various alternatives of the invention described herein may be employed in practicing the invention. For example, although the present invention has been described in terms of a dual-gate transistor, the present invention can be reflected to the left and the right in a repeating pattern to make a single transistor with a large number of gates. A typical power transistor application might utilize 20 gates. Thus, it is intended that the following claims define the scope of the invention and that structures and methods within the scope of these claims and their equivalents be covered thereby.

What is claimed is:

1. A PMOS transistor formed in a semiconductor material, the semiconductor material having a top surface and an n-type conductivity, the PMOS transistor comprising:
   a first doped region of a p-type conductivity formed in the semiconductor material to contact the top surface, the first doped region having a first width and a heavy dopant concentration;
   a second doped region of a p-type conductivity formed in the semiconductor material to contact the top surface, the second doped region having a second width and a heavy dopant concentration;
   a third doped region of the p-type conductivity formed in the semiconductor material to contact the top surface, the third doped region having a third width, a heavy dopant concentration, and lying between the first and second doped regions, the third width being greater than the first and second widths, the first, second, and third widths being measured normal to a shortest line that extends from the first doped region to the third doped region;
   a fourth doped region of the p-type conductivity formed in the semiconductor material to contact the top surface, the fourth doped region having a light dopant concentration and surrounding the third doped region at the top surface;
   a first channel region of the semiconductor material that lies between the first and third doped regions;
   a second channel region of the semiconductor material that lies between the second and third doped regions;
   a first insulation region formed on the semiconductor material over the first channel region;
   a second insulation region formed on the semiconductor material over the second channel region;
   a first gate formed on the first insulation layer over the first channel region;
   a second gate formed on the second insulation layer over the second channel region;
   an isolation region, the isolation region being formed adjacent to, and spaced apart from, two sides of the third doped region, and contacting the first and second channels regions, and the first and second doped regions; and
   a fifth doped region of the p-type conductivity, the fifth doped region contacting the first doped region and the isolation region and having a dopant concentration that is less than the first doped region.

2. The PMOS transistor of claim 1 wherein the third doped region only receives holes.

3. The PMOS transistor of claim 1 wherein the first and second gates are electrically connected together, and the first and second doped regions are electrically connected together.

4. A transistor formed in a semiconductor material, the semiconductor material having a top surface and a first conductivity type, the transistor comprising:
   a first doped region of a second conductivity type that contacts the top surface of the semiconductor material, the first doped region having a number of sides, a first width, and only a heavily-doped region;
   a second doped region of the second conductivity type that contacts the top surface of the semiconductor material, the second doped region having a number of sides, a second width, and only a heavily-doped region;
   a third doped region of the second conductivity type that contacts the top surface of the semiconductor material, the third doped region lying between the first and second doped regions, and having a number of sides, a third width, a lightly-doped region, and a heavily-doped region;
   a first channel region that lies between and contacts the first and third doped regions;
   a second channel region that lies between and contacts the second and third doped regions;
   a first insulation region that contacts the top surface of the semiconductor material over the first channel region;
   a second insulation region that contacts the top surface of the semiconductor material over the second channel region;
   a first gate that contacts the first insulation layer over the first channel region;
   a second gate that contacts the second insulation layer over the second channel region;
   a fourth doped region of the second conductivity type that contacts the top surface of the semiconductor material, the fourth doped region being lightly-doped and contacting the first doped region; and
   a fifth doped region of the second conductivity type that contacts the top surface of the semiconductor material, the fourth and fifth doped regions being spaced apart, the fifth doped region being lightly-doped and contacting the first doped region, the first, fourth, and fifth doped regions having a combined width that is substantially equal to the third width, the combined width and the third width being measured normal to a shortest line that extends from the first doped region to the third doped region.

5. The transistor of claim 4 wherein the first width is less than the third width, the first and third widths being measured normal to said shortest line that extends from the first doped region to the third doped region.

6. The transistor of claim 5 wherein the first width is less than a width of the heavily-doped region of the third doped region, the width of the heavily-doped region of the third doped region being measured normal to said shortest line.

7. The transistor of claim 4 and further comprising an isolation region that surrounds the first, second, and third doped regions at the top surface, the isolation region contacting only one side of the first doped region, and no portion of the heavily-doped region of the third doped region.

8. The transistor of claim 7 wherein the isolation region contacts only one side of the second doped region.

9. A transistor formed in a semiconductor material, the semiconductor material having a top surface and a first conductivity type, the transistor comprising:
   a first doped region of a second conductivity type that contacts the top surface of the semiconductor material, the first doped region having a number of sides, a first width, and only a heavily-doped region;
   a second doped region of the second conductivity type that contacts the top surface of the semiconductor material, the second doped region having a number of sides, a second width, and only a heavily-doped region;
   a third doped region of the second conductivity type that contacts the top surface of the semiconductor material, the third doped region lying between the first and second doped regions, and having a number of sides, a third width, a lightly-doped region, and a heavily-doped region, the first width being less than the third width, the first and third widths being measured normal to a shortest line that extends from the first doped region to the third doped region, the first width being equal to a width of the heavily-doped region of the third doped region, the width of the heavily-doped region of the third doped region being measured normal to said shortest line;
   a first channel region that lies between and contacts the first and third doped regions;
   a second channel region that lies between and contacts the second and third doped regions;
   a first insulation region that contacts the top surface of the semiconductor material over the first channel region;
   a second insulation region that contacts the top surface of the semiconductor material over the second channel region;
   a first gate that contacts the first insulation layer over the first channel region; and
   a second gate that contacts the second insulation layer over the second channel region.

10. A transistor formed in a semiconductor material, the semiconductor material having a top surface and a first conductivity type, the transistor comprising:
   a first doped region of a second conductivity type that contacts the top surface of the semiconductor material, the first doped region having a first width and only a heavily-doped region;
   a second doped region of the second conductivity type that contacts the top surface of the semiconductor material, the second doped region having a second width and only a heavily-doped region;
   a third doped region of the second conductivity type that contacts the top surface of the semiconductor material, the third doped region lying between the first and second doped regions, and having a third width, a lightly-doped region, and a heavily-doped region, the first width being less than the third width, the first and third widths being measured normal to a shortest line that extends from the first doped region to the third doped region, the first width being equal to a width of the heavily-doped region of the third doped region, the width of the heavily-doped region of the third doped region being measured normal to said shortest line;
   a first channel region that lies between and contacts the first and third doped regions;
   a second channel region that lies between and contacts the second and third doped regions;
   a first insulation region that contacts the top surface of the semiconductor material over the first channel region;
   a second insulation region that contacts the top surface of the semiconductor material over the second channel region;
   a first gate that contacts the first insulation layer over the first channel region; and
   a second gate that contacts the second insulation layer over the second channel region.

* * * * *